United States Patent [19]

Chemla et al.

[11] Patent Number: 5,047,810
[45] Date of Patent: Sep. 10, 1991

[54] OPTICALLY CONTROLLED RESONANT TUNNELING ELECTRONIC DEVICES

[75] Inventors: Daniel S. Chemla, Rumson; David A. B. Miller, Fair Haven; Stephan Schmitt-Rink, Berkeley Heights, all of N.J.

[73] Assignee: AT&T Bell Laboratories, Murray Hill, N.J.

[21] Appl. No.: 294,225

[22] Filed: Jan. 9, 1989

[51] Int. Cl.⁵ .......................................... H01L 27/12
[52] U.S. Cl. ....................................... 357/4; 357/17; 357/30
[58] Field of Search .................... 357/4 SL, 4, 30, 17

[56] References Cited

U.S. PATENT DOCUMENTS

| | | | |
|---|---|---|---|
| 4,503,447 | 3/1985 | Iafrate | 357/4 SL |
| 4,525,731 | 6/1985 | Chappell | 357/4 SL |
| 4,873,555 | 10/1989 | Coon et al. | 357/4 |
| 4,903,101 | 2/1990 | Maserjian | 357/4 |

OTHER PUBLICATIONS

A New Functional, Resonant Tunneling Hot Electron Transistor (RHET); Yoko Yama; Sep. 9, 1985, pp. 1+.
*Appl. Physics Letters*, vol. 24, No. 12, Jun. 15, 1974, "Resonant Tunneling in Semiconductor Double Barriers*", L. L. Chang et al., pp. 592-595.
*IEEE Journal Quantum Elec.*, vol. QE-22, No. 9, Sep. 1986, "A Bird's-Eye View on Evolution of Semiconductor Superlattices and Quantum Wells," L. Esaki, pp. 1611-1624.
*Elec. Letters*, vol. 23, No. 3, Jan. 29, 1987, "Negative Differential Resistance at Room Temperature from Resonant Tunnelling . . . ", M. Razeghi et al., pp. 116-117.
*Phys. Review Letters*, vol. 59, No. 9, Aug. 31, 1987, "Generation of Ultrashort Electrical Pulses Through Screening by Virtual Populations in Biased . . . ", D. S. Chemla et al., pp. 1018-1021.

*Primary Examiner*—Eugene R. LaRoche
*Assistant Examiner*—R. Ratliff
*Attorney, Agent, or Firm*—Gregory C. Ranieri

[57] ABSTRACT

Resonant tunneling devices having an improved device switching speed are realized by including an optical control element rather than an electrical control element for switching the device from one stable state to the other. The resulting optoelectronic device including at least one double barrier quantum well semiconductor heterostructure is controllably switched from an active state to an inactive state and vice versa by impinging optical signals from an optical control element having a mean photon energy less than the bandgap energy of the double barrier quantum well semiconductor heterostructure, wherein the active state of the device exhibits conduction of charge carriers by resonant tunneling. Improvement in the switching speed occurs because the optical processes initiated by the optical control element are condsiderably faster than the electronic processes induced by prior art electrical control elements.

16 Claims, 5 Drawing Sheets n-EMITTER    p-BASE    n-COLLECTOR

OPTICALLY CONTROLLED RESONANT TUNNELING ELECTRONIC DEVICES

TECHNICAL FIELD

This invention relates to apparatus including semiconductor devices whose operation is based on resonant tunneling of carriers through a quantum well region.

BACKGROUND OF THE INVENTION

Device switching speed has continued to be the operational parameter of single most importance for semiconductor devices used in communication, switching and computation applications. In order to improve device switching speed, many different physical effects have been studied. One such physical phenomenon which has led to faster semiconductor devices is that of particle tunneling through an energy barrier and, more particularly, resonant tunneling in structures having two or more energy barriers.

In resonant tunneling devices, two or more energy barrier layers surround (in two dimensions) one or more potential well layers. Resonant tunneling occurs when a charge carrier tunnels through an energy eigenstate of the potential well in response to an applied electric field. See, for example, the double barrier resonant tunneling electronic device described in *Appl. Phys. Lett.*, 24, pp. 593-5 (1974).

Attempts at enhancing operational characteristics of double barrier resonant tunneling devices by modulation doping, creating dissimilar barrier heights, and the like have achieved some success at improving device switching speed. However, the success of these and other enhancement techniques depend almost entirely on improving carrier mobility under applied electric field conditions.

SUMMARY OF THE INVENTION

Resonant tunneling devices having an improved device switching speed are realized by including an optical element rather than an electrical control element for switching the device from one stable state to the other. Switching speed improvements occur because the optical processes initiated by the optical control element are considerably faster than the electronic processes induced by prior art electrical control elements.

In one embodiment of the invention, an optoelectronic device including at least one double barrier quantum well semiconductor heterostructure is controllably switched from an active state to an inactive state and vice versa by impinging optical signals having a mean photon energy less than the bandgap energy of the double barrier quantum well semiconductor heterostructure, wherein the active state of the optoelectronic device exhibits conduction of charge carriers by resonant tunneling.

In other embodiments of the invention, the optoelectronic device comprises semiconductor diode and transistor arrangements.

BRIEF DESCRIPTION OF THE DRAWING

A more complete understanding of the principles of the invention may be obtained by reading the following description of specific illustrative embodiments of the invention in conjunction with the appended drawings in which.

DETAILED DESCRIPTION

Electrically controlled double barrier quantum well semiconductor heterostructure devices exhibiting resonant tunneling of charge carriers in the active or conducting state of operation are well known in the prior art. Conduction band profiles, IV characteristics and an exemplary embodiment of one such electrically controlled device having a double barrier quantum well semiconductor heterostructure is shown in FIGS. 1 through 5.

As depicted in FIGS. 1 through 4, the principle of resonant tunneling is shown schematically as bringing at least one quasi-confined eigenstate in a quantum well confined by two narrow barriers into coincidence with the Fermi energy level of a doped region outside one barrier by application of a bias voltage. A resonant increase in the tunneling probability and, therefore, a current maximum occur when the voltage applied to the barrier layers is such that the Fermi energy outside the barrier is equal to the energy of one of the eigenstates ($E_0$, $E_1$) in the quantum well. Additional bias destroys the resonant alignment and causes a condition of negative differential resistance to occur.

Figure 1:
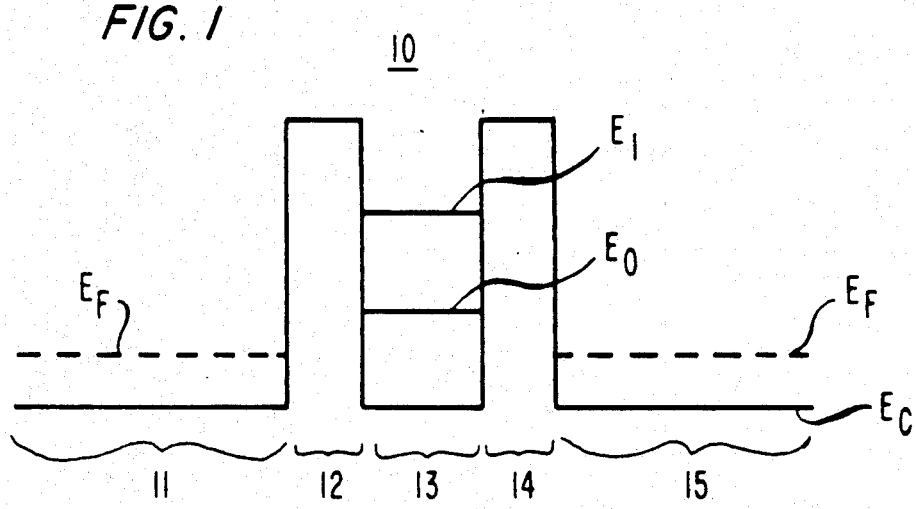
FIG. 1-3 show conduction band profiles for a double barrier quantum well semiconductor heterostructure exhibiting resonant tunneling.

In FIG. 1, barrier layers 12 and 14 are formed on opposite sides of quantum well layer 13. External layers 11 and 15 are formed outside barrier layers 12 and 14, respectively. The combination of layers 11 through 15 defines double barrier quantum well semiconductor heterostructure 10. External layers 11 and 15 comprise doped, narrow bandgap semiconductor material such as GaAs. Barrier layers 12 and 14 comprise undoped, wide bandgap semiconductor material such as AlGaAs grown to a narrow thickness of approximately 20 to 50Å. Quantum well layer 3 comprises undoped, narrow bandgap semiconductor material such as GaAs grown to a thickness of approximately 50 to 250Å. In general, layers 11, 13 and 15 comprise semiconductor material having substantially identical bandgaps. Fermi energy, $E_f$ is shown above conduction band energy $E_c$ in layers 11 and 15. Quasi-confined eigenstates $E_0$ and $E_1$ are shown in quantum well layer 13. Typical values for the quasi-confined eigenstate energies relative to $E_c$ are in the range of 30 meV to 100 meV depending on the width and composition of quantum well layer 13. As shown in FIG. 1, double barrier quantum well semiconductor heterostructure 10 is shown with zero applied electric field. Under this condition, no current flows through the heterostructure.

Figure 2:
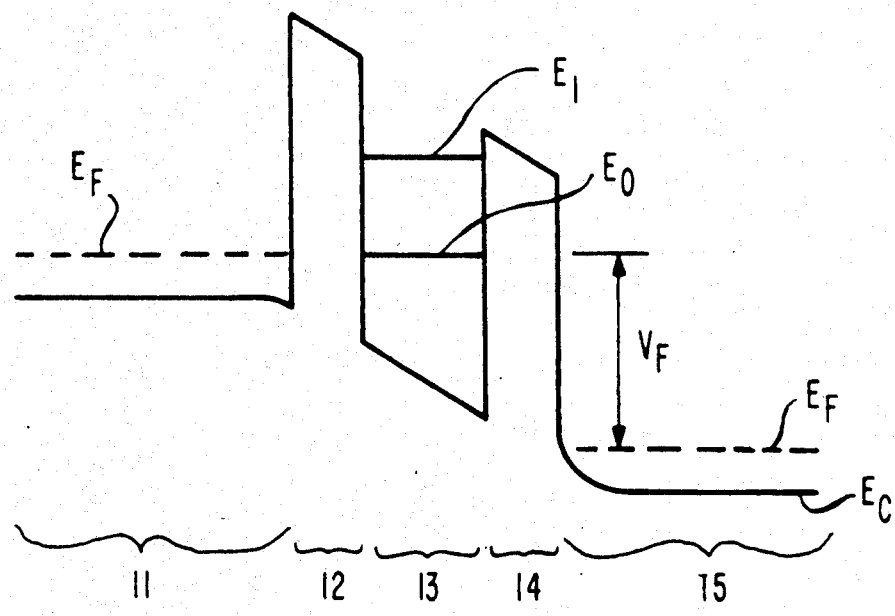
Figure 3:
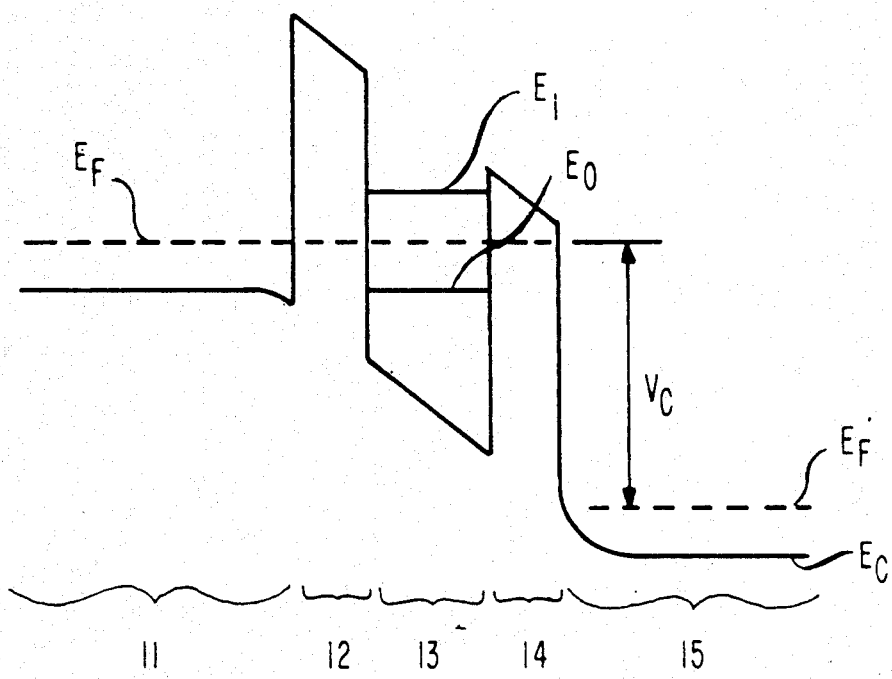

In FIG. 2, double barrier quantum well semiconductor heterostructure 10 is shown under influence of an applied electric field induced by voltage $V_f$. The voltage increase brings quasi-confined eigenstate $E_0$ into coincidence with $E_f$ causing current to flow across the heterostructure. Current continues to flow until sufficient voltage ($V_c$) is applied across heterostructure 10 to cause eigenstate $E_0$ to be at a level below the conduction band energy, $E_c$.

Figure 4:
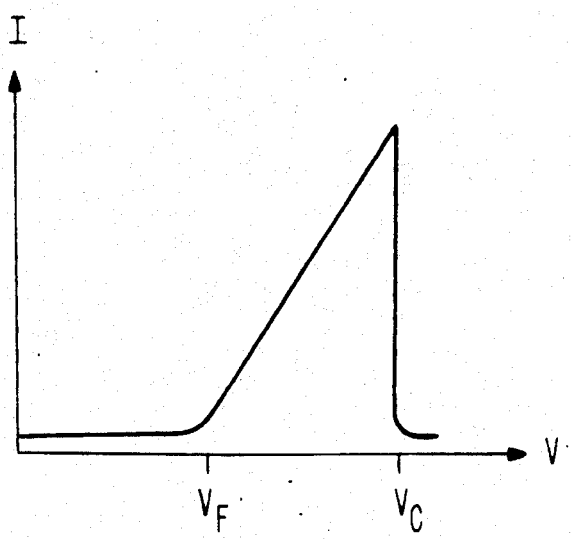
FIG. 4 shows a graph of current vs. voltage for the device of FIGS. 1-3.

The increase in current due to resonant tunneling for voltages above $V_f$ and the subsequent sharp drop in current flow for voltages at or above $V_c$ are depicted in the graph of current versus voltage shown in FIG. 4.

Figure 5:
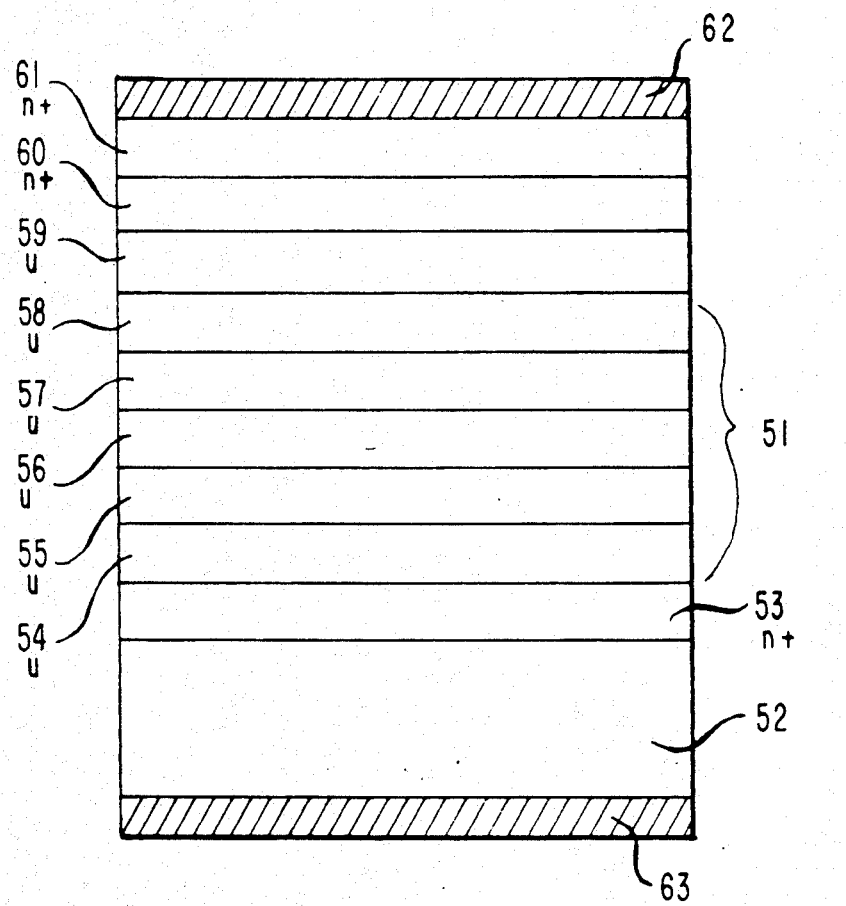
FIG. 5 shows one embodiment of an exemplary electronic device comprising the heterostructure of FIG. 1 including an electrical control element.

Representative device structure including the profiles and characteristics of double barrier quantum well semiconductor heterostructure 10 shown in FIGS. 1 through 4 is depicted in FIG. 5 as electrically controlled resonant tunneling device 50. Device 50 may be fabricated by standard epitaxial processing techniques such as molecular beam epitaxy and vapor phase epitaxy such as metal organic chemical vapor deposition. The growth process is started with GaAs substrate 52 doped with silicon to exhibit n+ conductivity. Epitaxially deposited on substrate 52 is a GaAs buffer layer which is silicon doped (n+ with approximately $5 \times 10^{17}$ atoms/cm$^3$) and which has a thickness of approximately 1 micron. Nominally undoped double barrier quantum well semiconductor heterostructure 51 is grown above layer 53. The heterostructure includes: GaAs layer 54 having a thickness of approximately 0.25 microns; barrier layer 55 of AlAs having a thickness of approximately 20Å; quantum well layer 56 comprising GaAs having a thickness of approximately 70Å; barrier layer 57 comprising AlAs having a thickness of approximately 20Å and an undoped channel layer 58 having a thickness of approximately 200Å.

Barrier and quantum well layers may have homogeneous or heterogeneous compositions as in the case of linearly graded barrier layers or a parabolically graded quantum well layer. Typically, the bandgap of the material selected for the quantum well layer is less than the bandgap of the material selected for the barrier layers.

A heterojunction preferably in the form of a modulation doped heterojunction is grown above double barrier quantum well semiconductor heterostructure 51. As shown in FIG. 5, an exemplary modulation doped AlGaAs/GaAs heterojunction consists of: previously grown channel layer 58; a nominally undoped spacer layer 59 comprising AlGaAs (Al mole fraction of 0.35) having a thickness of approximately 80Å; a doped donor layer 60 having a thickness of approximately 400Å and doped n+ with silicon at a concentration of approximately $2 \times 10^{18}$ /cm$^3$. In this heterojunction, channel layer 58 contains a high mobility electron gas having a density of approximately $10^{18}$ /cm$^3$ spatially separated by spacer layer 59 from the parent donors in donor layer 60. Use of a modulation doped heterojunction is desirable in facilitating formation of a low resistance ohmic contact to the heterojunction while keeping dopants away from the double barrier quantum well semiconductor heterostructure 51. Also, spacer layer 59 provides a means for passivating the adjacent channel layer 58.

Contact layer 61 comprising doped GaAs of n+ conductivity is formed on donor layer 10. Contact layer 61 has a doping concentration of approximately $2 \times 10^{17}$ /cm$^3$ of silicon and a thickness of approximately 1400Å.

Electrical contact pads 62 and 63 are formed on layers 61 and 52, respectively. Standard photolithographic and metalization techniques are used to form pads 62 and 63. Homogeneous and alloyed metals are contemplated for use as pads 62 and 63. For example, successive evaporation of germanium, gold, silver, and gold followed by a short heat treatment (annealing) period at an appropriate temperature is suitable for forming exemplary alloyed contact pads.

It is understood by those skilled in the art that the device shown in FIG. 5 is an electrically controlled, resonant tunneling diode including a double barrier quantum well semiconductor heterostructure and the modulation doped region. The diode operates substantially in accordance with the principles described above in relation to FIGS. 1 through 4. That is, by applying a voltage to contact pads 62 and 63, the device can be caused to conduct by resonant tunneling charge carriers provided that the voltage applied is sufficient to cause the lowest quasi-bound eigenstate within the double barrier quantum well semiconductor heterostructure to coincide with the Fermi level, $E_f$, outside of barrier layer.

Figure 6:
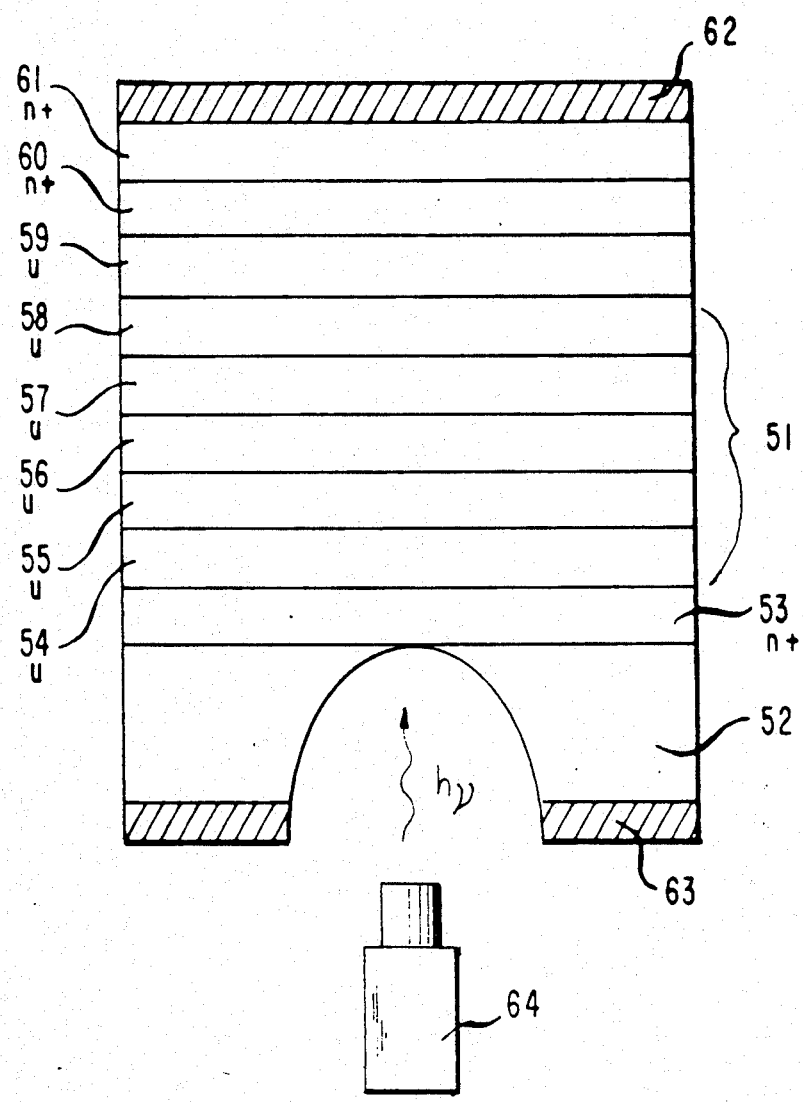
FIG. 6 shows an embodiment of an optoelectronic device in accordance with the principles of the present invention.

FIG. 6 shows one embodiment of an optoelectronic device in accordance with the principles of this invention. The term "optoelectronic device" is understood to include any device within the family of optically controlled electronic devices capable of operating in a conducting state by resonant tunneling of charge carriers through a double barrier quantum well semiconductor heterostructure. Electronic devices are contemplated as diode or transistor structures such as FETs, bipolar devices, unijunction devices and the like.

The optoelectronic device shown in FIG. 5 includes the semiconductor layers and contact pads shown for diode device 50 (FIG. 5) in combination with light source 64. Light source 64 includes a light emitting diode, a semiconductor laser, or any other light source capable of generating optical signals having a mean photon energy $h\nu$ less than the bandgap energy of the double barrier quantum well semiconductor heterostructure. That is, $h\nu$ is less than $E_c-E_v$ where $E_c$ is the energy level of a conduction band and $E_v$ is the energy level of the valence band.

As shown in FIG. 6, the optoelectronic device includes a modification of substrate layer 52 in order to permit optical signals from light source 64 to reach the double barrier quantum well semiconductor heterostructure. This modification is accomplished by using the metalization of contact pad 63 as a mask for subsequent etching of the substrate layer 52. Material selective wet chemical etchants such as a combination of hydrogen peroxide and ammonium hydroxide (pH approximately 7.2) applied to the exposed portion of the substrate between sections of contact pad 63 remove the exposed portions of substrate 52. Etching is halted when a suitable amount of substrate 52 has been removed such as when layer 53 is exposed.

It is understood by those skilled in the art that the modification of substrate layer 52 is required because of the high absorption of impinging optical signals in GaAs substrate layer 52. While the modification described above permits optical signals to impinge on the double barrier quantum well semiconductor heterostructure, it also decreases the ruggedness of the device making it more susceptible to breakage or cracking from applied mechanical forces. To circumvent these problems and the need for the above described substrate modification, it is contemplated that other material systems be employed in which the growth substrate layer is totally transparent (nonabsorbing) for impinging optical signals. Such material systems include semiconductor compounds from the Group III-V material systems based on InP and the like described hereinbelow.

In operation, the optoelectronic device shown in FIG. 6 is preferably biased to be in a nonconducting state. Generally, an electric field induced by a bias voltage, $V_b$, to contact pads 62 and 63 where $V_b$ is greater than $V_c$ is sufficient to cause double barrier quantum well semiconductor heterostructure 51 to inhibit conduction. Optical signals impinging on double barrier quantum well semiconductor heterostructure 51 cause a small internal electric field to arise within the quantum well layer to counteract the electric field induced by the bias voltage. This effect has been described for biased quantum wells in *Phys. Rev. Lett.*, Vol. 59, No. 9, pp. 1018-21 (1987). The effect for the double barrier quantum well semiconductor heterostructure is understood as follows. When the diode is biased just above the cut off voltage, $V_c$, an optical pulse of light having a mean photon energy below the bandgap energy produces an AC Stark shift of the quasi-confined eigenstates ($E_0$, $E_1$) toward higher energy and the generation of an internal static electric field opposed to the electric field induced by the applied bias voltage. With respect to the AC Stark shift, it should be noted that only the quasi-confined eigenstates move toward higher energy without a corresponding movement of the conduction band minimum, $E_c$ because coupling of the energy levels in the doped material outside the barrier layers with the light induced field is quenched by the exclusion principle. The internal static field effect combines with the AC Stark effect to bring eigenstate $E_0$ in coincidence with the lowest occupied level in the material outside the barrier layers (region 11). As a result, the characteristic operation point of the diode is moved back to a point where the diode exhibits conduction by resonant tunneling of charge carriers through the double barrier quantum well semiconductor heterostructure. When the optical signals no longer impinge on the double barrier quantum well semiconductor heterostructure, the diode reverts back to its normal state, nonconducting, with a bias voltage greater than the cut off voltage $V_c$.

Both the intensity of the optical signals and their means photon energy relative to the bandgap energy of double barrier quantum well semiconductor heterostructure 51 determine the magnitude of the internal electric field induced by the optical signals from light source 64 impinging on double barrier quantum well semiconductor heterostructure 51. It has been determined experimentally that a 5 meV shift (detuning) is obtained in a GaAs quantum well for impinging optical signals at approximately 200 MW/cm$^2$ having a pulse width of approximately 100 fs in the transparency range of the quantum well. In another experimental example, it has been determined that typical values of the optical signal pulse intensity impinging on GaAs quantum wells ($\approx 100$Å) are between 100 MW/cm$^2$ (picosecond pulses) and 1 GW/cm$^2$ (femtosecond pulses) when employed for detuning the mean photon energy below the conduction band energy by approximately 30 meV to 50 meV. Finally, it has been determined from another experiment that a 100Å GaAs quantum well will experience a shift of the quasi-confined eigenstate of 0.22 meV for optical signals having an intensity of 8 MW/cm$^2$ and a mean photon energy approximately 30 meV below the conduction band of the quantum well.

The actual relationship for determining the amount of shift for the quasi-confined eigenstate in response to optical signals at energy $h\nu$ is as follows:

$$\delta E_o = \frac{2|\mu_{cv}\xi_\nu|^2}{(E_o - h\nu)} \frac{|\phi(r=0)|^2}{N_s}$$

where $\mu_{cv}$ is the interband transition matrix element; $\xi_\nu$ is the optical field (frequency $\nu$); $E_0$ is the energy of the first level in the QW; $h\nu$ is the photon energy of the optical field; $[E_0 - h\nu]$ is the detuning (eV); $|\phi(r=0)|^2$ is the square of the envelope function of the exciton for $r=0$; $N_s$ is the saturation density; $\xi E_0$ is the shift in the quasi-confined eigenstate (eV).

$$\delta E_o \approx 8 \times 10^{-13} \frac{I}{(E_o - h\nu)}$$

where I is the intensity of the optical signals expressed in W/cm$^2$.

Figure 7:
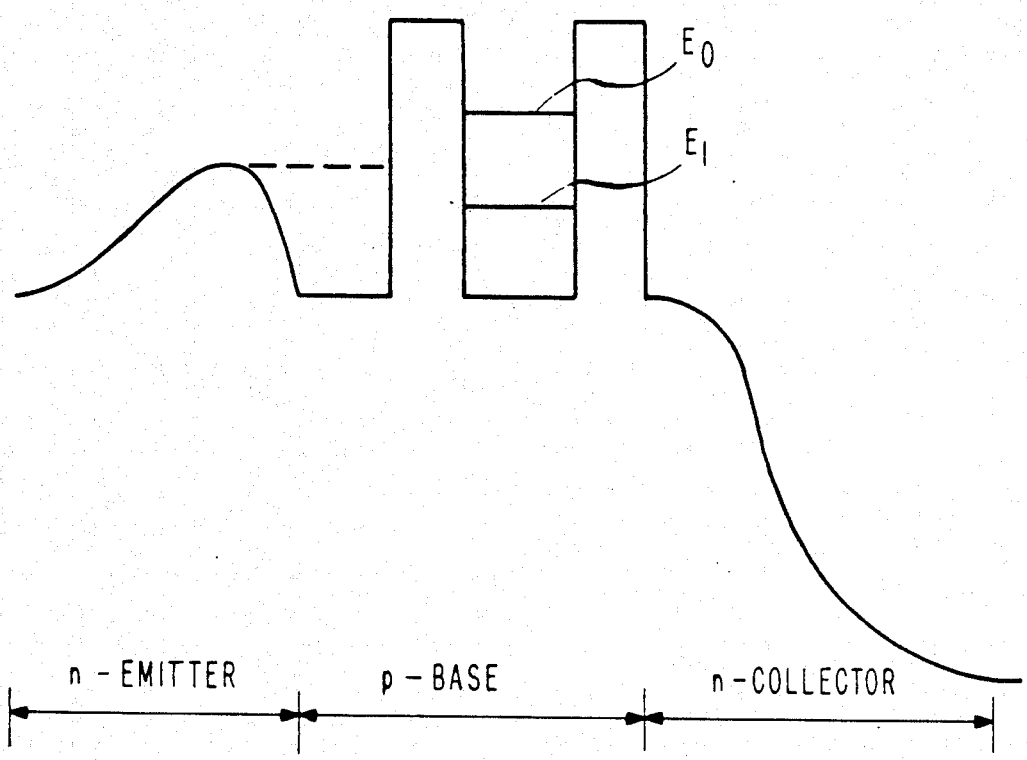
FIG. 7 shows the conduction band profile of a second embodiment of the optoelectronic device in accordance with the principles of the present invention.
Figure 8:
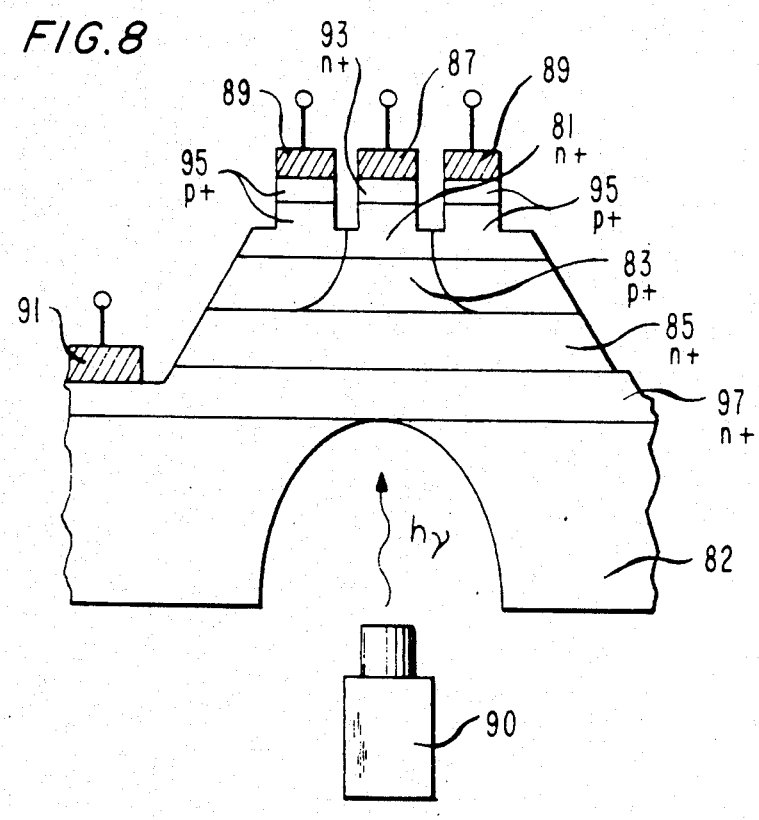
FIG. 8 shows an exemplary layer structure for a second embodiment of the optoelectronic device in accordance with the principles of the present invention.

FIGS. 7 and 8 shows a conduction band profile diagram and an exemplary semiconductor layer structure, respectively, for an optically controlled resonant tunneling bipolar transistor in accordance with the principles of this invention. The electronic device shown in FIGS. 7 and 8 comprises emitter region 81, base region 83, and collector region 85. Electrical contact pads 87, 89 and 91 are made to the emitter, base, and collector regions, respectively. Contact quality is improved by the use of heavily doped regions 93, 95, and 97 in contact with the emitter, base, and collector regions, respectively. As depicted in the FIG., electrical contact pad 89 is an annular contact. All layers are grown on a suitable substrate 82. If necessary, the subtrate 82 is etched in the vicinity of the base region to permit optical signals from light source 90 to impinge on the double barrier quantum well semiconductor heterostructure within the base region. The electronic device shown employs a heterojunction with the emitter region having a wider energy bandgap than the portion of the base region adjacent to the emitter region. The heterojunction is type I so that the conduction and valence bands in the wide bandgap region are above and below, respectively, the conduction and valence bands in the narrow bandgap region. Although bandgap grading is used to produce a nearly abrupt emitter region as shown in FIG. 7, other techniques such as degenerate doping may be employed to form the emitter region.

In one specific embodiment, the emitter region comprises AlGaAs with an aluminum mole fraction less than or equal to 0.4 and n-type doping at a concentration greater than $10^{17}$/cm$^3$. The base region is p-type conductivity with a doping concentration of approximately $2 \times 10^{18}$/cm$^3$ and approximately 800 to 1000 Å in thickness. Preferably, double barrier quantum well semiconductor heterostructure is centrally located within the base region. In general, the base region thickness as measured between the emitter region and the nearest barrier in the double barrier quantum well semiconductor heterostructure should be selected to be smaller than the scattering mean free path of an electron injected from the emitter but greater than the zero bias depletion width on the p side of the emitter base junction. The double barrier quantum well semiconductor heterostructure is desirably GaAs/AlGaAs or GaAs/AlAs as described in reference to FIG. 5.

Fabrication techniques including semiconductor layer growth, photolithography and contact metalization in accordance with the procedures described above. Exemplary device fabrication for an AlGaAs/GaAs bipolar transistor is described in *Appl. Phys. Lett.*, 46, pp. 600-603, (1985).

In operation, the base emitter junction is generally forward biased, whereas the base collector junction is generally reversed biased. As the base-emitter voltage increases, the energy difference between the top of the ballistic electron in the emitter region and the first quasi-confined eigenstate in the quantum well layer decreases. When the two energy levels coincide, electrons are ballistically launched from the emitter into the resonant eigenstate within the quantum well to undergo resonant tunneling through the double barrier quantum well semiconductor heterostructure with near unity transmission probability. In order to operate this device in accordance with the principles of the invention, the base-emitter bias voltage and the base-collector voltage may be selected to place the electronic device in either a resonant conduction state (normally on) or a nonresonant state (normally off). Optical signals from light source 90 having a mean photon energy below the bandgap of the double barrier quantum well semiconductor heterostructure impinge on the base region of the electronic device. For an electronic device biased to be normally on, optical signal from light source 90 cause the above described AC Stark shift and internal opposing electric field to occur for causing a shift in the quasi-confined eigenstate. As a result, the transistor is switched from its normally on state to a nonconducting off state by the impinging optical signals. Similarly, for an electronic device biased to be normally off, optical signals from light source 90 cause the above described AC Stark shift and internal opposing electric field to occur for causing a shift in the quasi-confined eigenstate. As a result, the transistor is switched from its normally off state to a resonant conducting on state by the impinging optical signals.

It is understood that, while the material system GaAs/AlAs is described above for fabricating the electrically controlled device having a double barrier quantum well semiconductor heterostructure, other material combinations may be selected from other semiconductor Group III-V systems such as GaAs/AlGaAs, InGaAs/InAlAs, InGaAs/InGaAlAs, GaAsSb/GaAlAsSb and InGaAsP/InP. In these semiconductor systems, the layers may be lattice-matched to suitable GaAs or InP substrates. Lattice mismatching is also contemplated wherein strained layers are grown over the substrate material. Finally, extension of the device structures is also contemplated to semiconductor compounds in Group II-VI and Group II-IV.

We claim:

1. An optoelectronic device having active and inactive states of operation, said active state corresponding to conduction by resonant tunneling of carriers, said optoelectronic device including at least one double barrier quantum well semiconductor heterostructure wherein said resonant tunneling occurs through both barriers of each said double barrier quantum well semiconductor heterostructure into and out of the lowest quasi-confined eigenstate of the quantum well, means for applying an electrical potential to said at least one double barrier quantum well semiconductor heterostructure, means for applying a signal to said at least one double barrier quantum well semiconductor heterostructure to control the state of operation of said optoelectronic device, said signal applying means including a source of an optical signal having a mean photon energy less than a bandgap energy of said at least one double barrier quantum well semiconductor heterostructure and sufficient to cause a desired shift $\delta E_o$ for a quasi-confined eigenstate in a quantum well of the at least one double barrier quantum well semiconductor heterostructure, where the desired shift is, $$\delta E_o = \frac{2|\mu_{cv}\xi_v|^2}{(E_o - h\nu)} \frac{|\phi(r=0)|^2}{N_s}$$

where $\mu_{cv}$ is an interband transition matrix element; $\xi_v$ is an optical field at frequency $\nu$; $E_0$ is an energy of said lowest quasi-confined eigenstate in the quantum well; $h\nu$ is the mean photon energy of the optical signal; $|\phi(r=0)|^2$ is the square of an envelope function of an exciton for $r=0$; and $N_s$ is the saturation density.

2. The optoelectronic device as defined in claim 1 wherein said at least one double barrier quantum well semiconductor heterostructure is substantially undoped.

3. The optoelectronic device as defined in claim 2 wherein said at least one double barrier quantum well semiconductor heterostructure comprises material compounds consisting from compositions selected from Group III-V.

4. The optoelectronic device as defined in claim 2 wherein said at least one double barrier quantum well semiconductor heterostructure comprises material compounds consisting from compositions selected from Group II-VI.

5. The optoelectronic device as defined in claim 2 wherein said at least one double barrier quantum well semiconductor heterostructure comprises material compounds consisting from compositions selected from Group II-IV.

6. An optoelectronic device having active and inactive states of operation, said active state corresponding to conduction by resonant tunneling of carriers, said optoelectronic device including an electronic circuit element including at least one double barrier quantum well semiconductor heterostructure wherein said resonant tunneling occurs through both barriers of each said double barrier quantum well semiconductor heterostructure into and out of the lowest quasi-confined eigenstate of the quantum well, and means for applying an electrical potential to said at least one double barrier quantum well semiconductor heterostructure, means for applying a signal to said at least one double barrier quantum well semiconductor heterostructure to control the state of operation of said optoelectronic device, said signal applying means including a source of an optical signal having a mean photon energy less than a bandgap energy of said at least one double barrier quantum well semiconductor heterostructure and sufficient to cause a desired shift $\delta E_o$ for a quasi-confined eigenstate in a quantum well of the at least one double barrier quantum well semiconductor heterostructure, where the desired shift is, $$\delta E_o = \frac{2|\mu_{cv}\xi_\nu|^2}{(E_o - h\nu)} \frac{|\phi(r=0)|^2}{N_s}$$

where $\mu_{cv}$ is an interband transition matrix element; $\xi_\nu$ is an optical field at frequency $\nu$; $E_0$ is an energy of said lowest quasi-confined eigenstate in the quantum well; $h\nu$ is the mean photon energy of the optical signal; $|\phi(r=0)|^2$ is the square of an envelope fuction of an exciton for $r=0$; and $N_s$ is the saturation density.

7. The optoelectronic device as defined in claim 6 wherein said at least one double barrier quantum well semiconductor heterostructure is substantially undoped.

8. The optoelectronic device as defined in claim 7 wherein said at least one double barrier quantum well semiconductor heterostructure comprises material compounds consisting from compositions selected from Group III-V.

9. The optoelectronic device as defined in claim 7 wherein said at least one double barrier quantum well semiconductor heterostructure comprises material compounds consisting from compositions selected from Group II-VI.

10. The optoelectronic device as defined in claim 9 wherein said at least one double barrier quantum well semiconductor heterostructure comprises material compounds consisting from compositions selected from Group II-IV.

11. The optoelectronic device as defined in claim 7 wherein said electronic circuit element includes a resonant tunneling diode.

12. The optoelectronic device as defined in claim 11 wherein said at least one double barrier quantum well semiconductor heterostructure comprises material compounds consisting from compositions selected from Group III-V.

13. The optoelectronic device as defined in claim 7 wherein said electronic circuit element includes a resonant tunneling bipolar transistor.

14. The optoelectronic device as defined in claim 13 wherein said at least one double barrier quantum well semiconductor heterostructure comprises material compounds consisting from compositions selected from Group III-V.

15. The optoelectronic device as defined in claim 14 wherein said at least one double barrier quantum well semiconductor heterostructure is included in a base region of said bipolar transistor.

16. The optoelectronic device as defined in claim 15 wherein said at least one double barrier quantum well semiconductor heterostructure comprises material compounds consisting from compositions selected from Group III-V.

* * * * *